(12) United States Patent
Thees et al.

(10) Patent No.: US 11,195,935 B2
(45) Date of Patent: Dec. 7, 2021

(54) SEMICONDUCTOR DEVICE WITH NOVEL SPACER STRUCTURES HAVING NOVEL CONFIGURATIONS

(71) Applicant: GLOBALFOUNDRIES U.S. Inc., Santa Clara, CA (US)

(72) Inventors: Hans-Juergen Thees, Dresden (DE); Peter Baars, Dresden (DE)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 16/531,617

(22) Filed: Aug. 5, 2019

(65) Prior Publication Data

US 2019/0363173 A1 Nov. 28, 2019

Related U.S. Application Data

(62) Division of application No. 15/956,926, filed on Apr. 19, 2018, now Pat. No. 10,475,901.

(51) Int. Cl.
| | |
|---|---|
| *H01L 29/66* | (2006.01) |
| *H01L 21/311* | (2006.01) |
| *H01L 21/266* | (2006.01) |
| *H01L 27/11* | (2006.01) |
| *H01L 21/3105* | (2006.01) |

(Continued)

(52) U.S. Cl.
CPC ........ *H01L 29/6653* (2013.01); *H01L 21/266* (2013.01); *H01L 21/31053* (2013.01); *H01L 21/31144* (2013.01); *H01L 27/1112* (2013.01); *H01L 29/0847* (2013.01); *H01L 29/78621* (2013.01); *H01L 21/31116* (2013.01); *H01L 21/76283* (2013.01); *H01L 29/66757* (2013.01); *H01L 29/66772* (2013.01)

(58) Field of Classification Search
CPC ........... H01L 29/6653; H01L 21/76283; H01L 21/3065; H01L 21/823418; H01L 29/0847; H01L 21/31144; H01L 21/266; H01L 27/1112; H01L 29/78621; H01L 21/31116; H01L 21/31053
See application file for complete search history.

(56) References Cited

U.S. PATENT DOCUMENTS

| | | | |
|---|---|---|---|
| 6,114,211 A | 9/2000 | Fulford et al. | |
| 6,225,173 B1 * | 5/2001 | Yu | H01L 29/66621 257/E21.429 |

(Continued)

OTHER PUBLICATIONS

Mikael Ostlilng et al., "Etching Lecture Notes KTH Royal Institute of Technology," 2013, 48 pages.

(Continued)

*Primary Examiner* — Shih Tsun A Chou
(74) *Attorney, Agent, or Firm* — Hoffman Warnick LLC (57) ABSTRACT

A semiconductor device is disclosed including a gate electrode structure and raised drain and source regions that extend to a first height level and a sidewall spacer element positioned adjacent the sidewalls of the gate electrode structure between the raised drain and source regions and the gate electrode structure. The sidewall spacer element includes an upper portion that extends above the first height level wherein an inner part of the spacer element faces the gate electrode structure and extends to a second height level that is less than a third height level of an outer part of the upper portion of the spacer element.

13 Claims, 6 Drawing Sheets

(51) Int. Cl.
*H01L 29/786* (2006.01)
*H01L 29/08* (2006.01)
*H01L 21/762* (2006.01)

(56) References Cited

U.S. PATENT DOCUMENTS

| | | | |
|---|---|---|---|
| 7,479,684 B2* | 1/2009 | Guha | H01L 29/78654 |
| | | | 257/410 |
| 8,530,317 B1* | 9/2013 | Wu | H01L 29/7833 |
| | | | 438/301 |
| 9,269,786 B2* | 2/2016 | Chou | H01L 29/511 |
| 2002/0028558 A1 | 3/2002 | Yang | |
| 2013/0178053 A1 | 7/2013 | Li et al. | |
| 2014/0256135 A1* | 9/2014 | Javorka | H01L 21/823828 |
| | | | 438/694 |
| 2015/0333148 A1 | 11/2015 | Koo et al. | |
| 2015/0364378 A1* | 12/2015 | Xie | H01L 21/76897 |
| | | | 257/368 |
| 2016/0204128 A1* | 7/2016 | Baars | H01L 27/0629 |
| | | | 257/296 |
| 2016/0351566 A1* | 12/2016 | Niimi | H01L 21/823418 |

OTHER PUBLICATIONS

Mack et al., "Semiconductor Lithography (Photolithography)—The Basic Process"; The Basics of Microlithography; Copyright 2006-2020; p. 11; <www.lithoguru.com/scientist/lithobasics.html#:~.text=The general sequence of processing.bak%2C development%2C and postbake>.

* cited by examiner

SEMICONDUCTOR DEVICE WITH NOVEL SPACER STRUCTURES HAVING NOVEL CONFIGURATIONS

BACKGROUND

1. Field of the Disclosure

Generally, the present disclosure relates to semiconductor devices and respective manufacturing techniques so as to form a semiconductor device that comprises novel spacer structures having novel configurations.

2. Description of the Related Art

Significant progress has been made in the field of semiconductor devices, such as integrated circuits, by continuously reducing the dimensions of the individual components, such as circuit elements in the form of transistor elements, capacitors, resistors and the like. For example, in currently available highly sophisticated integrated circuits, several hundred millions or more circuit elements, mainly transistor elements, may be formed on a single semiconductor chip, thereby offering the potential of integrating more and more functions into a single semiconductor device. By steadily reducing the dimensions of the circuit elements well below the optical resolution capability of presently available lithography techniques, thereby enabling the formation of circuit elements having lateral dimensions of 30 nm and even less, not only packing density of the integrated circuits may be readily increased, but also performance of individual circuit elements, such as transistor elements, may be improved. On the other hand, the continuous shrinkage of lateral dimensions of circuit elements is associated with significant technological challenges that have to be addressed so as to not unduly offset any advantages gained by the continuous reduction of lateral dimensions.

Currently, the CMOS technique is one of the most promising approaches in forming sophisticated integrated circuits, since, basically, highly complex control logic may be implemented on the basis of CMOS technology, while maintaining overall power consumption at a moderately low level. In CMOS technology, complementary transistors, i.e., N-type transistors and P-type transistors, may be fabricated on the basis of an appropriate initial semiconductor material, typically a crystalline silicon material, the characteristics of which may be appropriately adapted in order to comply with the requirements to be met by the individual transistor elements.

When forming respective transistor elements in the form of field effect transistors according to the CMOS technique, a transistor body may typically be prepared on the basis of appropriate dopant species for defining PN junctions, doped regions and the like, thereby finally obtaining so-called drain and source regions that are laterally separated by a channel region, the electronic characteristics of which may be controlled on the basis of a respective electrical field or a control voltage, thereby enabling the modulation of the conductivity of the channel region and, thus, the current flow through the transistor element under consideration. In addition to the overall lateral dimensions of a transistor, in particular the transistor width, which may determine, for otherwise identical conditions, the current-carrying capacity of the transistor element, other transistor parameters are of high relevance in order to obtain a specific transistor behavior and performance. For example, with respect to increasing switching speed, i.e., the speed of building up a conductive channel in the channel region upon applying an appropriate control voltage to the gate electrode structure formed adjacent to the channel region, the length of the channel region may be reduced. To this end, typically, a reduction of the respective lateral dimension of the gate electrode structure may be required, in particular, when a planar transistor configuration is considered. In currently available sophisticated integrated circuits, transistor elements based on a planar transistor architecture are available, which have a channel length and, thus, a gate length of 30 nm and even less, thereby requiring highly sophisticated manufacturing techniques for transferring a respective device pattern into the actual material layers of the semiconductor device.

The reduction of the channel length and generally the lateral dimensions of respective transistor elements, however, is not only accompanied by performance improvements but also entails a plurality of technical problems that need to be addressed, for instance, by increasing the respective capacitive coupling of the gate electrode material to the channel region while still preserving a certain minimum dielectric breakthrough voltage. Increased capacitive coupling may typically be addressed by providing a highly complex gate electrode structure, which may include high-k dielectric materials, possibly in combination with appropriate metal-containing electrode materials, barrier materials and the like, which may typically exhibit high sensitivity with respect to process-related atmospheres, for instance, established during etch and cleaning processes. Therefore, at least some of these complex gate materials may require thorough confinement during the various manufacturing processes so as to not unduly alter the material characteristics thereof, which may otherwise translate into respective variations of device characteristics.

Moreover, upon reducing the lateral dimensions of transistor elements, and thus the lateral dimensions of respective semiconductor regions, also referred to herein as active regions, in and on which the transistor elements have to be formed, other aspects have to be addressed, such as fluctuations of dopant species in sensitive areas, such as a channel region of a sophisticated transistor element, parasitic capacitance of respective transistor bodies, i.e., non-channel areas in the transistor element, and the like. For these reasons, various approaches have been developed in recent years in order to further enhance transistor performance while at the same time reducing overall transistor dimensions. For example, in some approaches, three-dimensional transistor architecture may be implemented to increase current-carrying capacity, channel controllability and the like, while still obtaining reduced lateral transistor dimensions. To this end, respective semiconductor fins may be provided, the sidewalls of which, possibly in combination with a top surface of these fins, may act as channel areas and may be covered by a respective gate electrode structure, thereby arriving at moderately high current-carrying capacity at reduced lateral dimensions.

In other sophisticated approaches, the well-established channel transistor architecture may be further enhanced by generally reducing parasitic capacitance, e.g., by providing a fully depleted channel region, which may be accomplished by using an extremely thin semiconductor base material as an active region, in and on which thereafter the gate electrode structure may be formed. Moreover, charge carrier speed in the semiconductor material, for instance in the crystalline silicon material, crystalline silicon/germanium mixture, and the like, may be increased by reducing the dopant concentration, thereby also reducing the fluctuations of dopant concentration within the channel region, which may otherwise give rise to increased charge carrier scattering, device variability and the like. For example, in presently available sophisticated planar transistor elements, the active region may be provided in the form of a thin initial semiconductor material having a thickness of 15 nm and even significantly less, wherein, frequently, an SOI (silicon- or semiconductor-on-insulator) architecture may be applied so that, in the depth direction, the thin semiconductor material is confined by a buried insulating layer. In addition to the superior confinement and, thus, reduced parasitic capacitance of the SOI architecture, the buried insulating material in combination with appropriately doped semiconductor material positioned below the buried insulating layer, an additional control mechanism, frequently referred to as back bias, may be accomplished, thereby further enhancing overall transistor performance and providing the potential for statically and/or dynamically changing transistor behavior, for instance, in terms of changing the threshold voltage and the like.

Due to the reduced thickness of the initial semiconductor material, typically, the drain and source regions may no longer be provided on the basis of a high dopant concentration formed in the initial semiconductor material, but may require the epitaxial growth of additional semiconductor material laterally adjacent to the gate electrode structure, thereby implementing a so-called raised drain and source configuration. The respective crystalline semiconductor material may be grown on the basis of selective epitaxial growth techniques and may allow in situ doping of the material, thereby obtaining the desired high dopant concentration and thus superior conductivity. Furthermore, the raised architecture of the drain and source regions still allows the implementation of respective mechanisms for reducing contact resistance, for instance by forming a metal semiconductor compound in an advanced manufacturing stage, such as by providing nickel silicide, nickel/platinum silicide and the like. Similarly, a corresponding highly conductive metal semiconductor compound may also be formed in a portion of the gate electrode structure, which may be accomplished during a common process sequence for forming a respective material in the raised drain and source regions and in the gate electrode structure.

Basically, the approach of forming transistor elements based on planar architecture using a raised drain and source configuration in combination with a sophisticated gate electrode structure offers the potential of forming powerful and highly integrated circuits, while still resulting in reduced process complexity compared to producing three-dimensional transistors. Nevertheless, it turns out that further device scaling and incorporating more and more functions into a single semiconductor chip may result in increasing technological challenges when forming respective planar transistor elements. For example, a typical process flow for forming transistor elements with critical dimensions of 30 nm and even less based on planner architecture with fully depleted configuration may require a complex process sequence for forming a respective gate electrode structure, typically including a plurality of sensitive materials that may require efficient confinement. The confinement may be accomplished by forming a respective sidewall spacer element or spacer structure that covers the sidewall of the sensitive electrode materials and dielectric materials of the gate electrode structure. Furthermore, a capping material may have to be formed upon patterning the gate electrode structure, which has to be removed in a later stage for forming a metal silicide in a portion of the gate electrode structure. In addition to the many etch and cleaning processes associated with forming the transistor after having patterned the gate electrode structure, also an efficient encapsulation of the materials of the gate electrode structure may be required during a corresponding selective epitaxial growth process sequence for forming respective in situ doped crystalline semiconductor materials for P-type transistors and N-type transistors, respectively.

During a corresponding selective epitaxial growth process, semiconductor material may preferably adhere to exposed semiconductor surface areas, while significant deposition on dielectric surface areas may be substantially avoided. Since, typically, P-type transistors and N-type transistors may require differently doped semiconductor materials, corresponding sequences for growing the crystalline semiconductor materials may involve the deposition of mask layers and subsequent partial removal thereof and the like. After having formed the raised drain and source regions with the desired in situ doping, the top surface of the gate electrode structures has to be exposed for the further processing, which may require respective removal steps, typically based on established isotropic wet chemical etch recipes, for instance using hot phosphoric acid, in order to remove silicon nitride material selectively with respect to oxide material.

As discussed above, typically, exposure of sensitive gate materials, which are typically positioned in the lower part of the gate electrode structure, has to be avoided, which may typically require the formation of a protective sacrificial spacer element prior to actually removing the capping material, wherein these spacer elements may have to provide high etch selectivity with respect to the etch chemistry used for removing the capping material. Generally, during this process sequence, it is attempted, on the one hand, to reliably remove the capping material from above the respective gate electrode structures, thereby necessarily also reducing a height of the initial sidewall spacer elements, thereby requiring a reduced overall etch time so as to not unduly remove material in the lower portions of the initial spacer elements. On the other hand, during the respective process sequence, large areas of capping material, for instance provided in the form of silicon nitride, may have to be removed in other device areas, thereby requiring a specific minimum etch time, which may thus result in a certain material removal of any previously formed protective sidewall spacers, for instance provided in the form of silicon dioxide spacer elements. Thereafter, these protective spacer elements may be removed, for instance, by a wet chemical etch recipe based on diluted hydrofluoric acid, which may exhibit a certain etch selectivity with respect to the underlying crystalline silicon material that is exposed during the etch sequence, which, however, may nevertheless result in unavoidable material loss in the previously formed raised drain and source regions.

Depending on the degree of material removal in respective initial sidewall spacers and sacrificial protective sidewall spacers during the preceding process sequence, there is a potential risk for introducing short circuit areas when forming a highly conductive metal semiconductor compound in the subsequent manufacturing stage, wherein any such highly conductive short circuits or bridges may result in device failure due to a direct electrical contact between portions of the gate electrode structure and the drain and source regions. For this reason, typically, a further deposition process may have to be applied, in which a spacer material may be deposited and may be patterned so as to re-establish or repair any damages in respective upper parts of the initial sidewall spacer elements, thereby attempting to re-establish the confinement of the sidewalls of the gate electrode structure.

Moreover, in complex integrated circuits, not only transistor elements may have to be formed in the device level, but also passive circuit elements, such as resistors, may have to be provided in compliance with the overall circuit design. For example, resistors may be formed on the basis of a material stack that is basically of the same configuration as the material stack used for gate electrode structures, wherein, however, in order to obtain a desired moderately high resistivity, a significant part of the respective "electrode structure" of the resistor may have to be covered during the subsequent formation of a highly conductive metal semiconductor compound, since, otherwise, non-covering would result in a relatively low resistivity of the respective resistive structure due to the highly conductive metal semiconductor compound. Consequently, a respective mask is typically provided in this manufacturing stage so as to reliably cover respective portions of the semiconductor device, which may not require the incorporation of a highly conductive metal semiconductor compound, such as perspective portions of the electrode structure of resistors, while on the other hand, gate electrode structures of transistor elements and raised drain and source regions may remain exposed. The highly complex process sequence for removing the capping material of the gate electrode structures and for removing a part of the capping material of other circuit elements, such as resistors, in combination with the additional process sequence required for repairing damage of sidewall spacers and forming an additional mask prior to performing the sequence for obtaining the highly conductive metal semiconductor compound generally contributes to a moderately high degree of complexity in this manufacturing stage of these conventional strategies.

In view of the situation described above, the present disclosure provides manufacturing techniques and respective semiconductor devices in which gate electrode structures may be efficiently exposed for forming therein a highly conductive semiconductor metal compound, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is based on the concept that the relatively complex process sequence for removing a capping material from gate electrode structures prior to the process of incorporating a highly conductive metal semiconductor compound may be made significantly more efficient by embedding the semiconductor device in an appropriate fill material, such as an oxide material, thereby reducing material loss in raised drain and source regions while also reducing the risk of generating critical device areas, which may result in unwanted short circuits or bridges after having incorporated the highly conductive metal semiconductor compound. Moreover, by using the fill material, the process of providing sacrificial protective spacer elements may, in some illustrative embodiments, be omitted, thereby also reducing overall process complexity. Furthermore, in some illustrative embodiments disclosed herein, the removal process may be based on a plasma-assisted anisotropic etch process rather than using a wet chemical etch chemistry as in conventional strategies, thereby also contributing to superior process conditions and reduced process related failures. In some illustrative embodiments disclosed herein, the plasma-assisted etch process may be performed on the basis of an etch mask, which may additionally ensure that the capping material may be preserved in areas in which the formation of a metal semiconductor compound is to be avoided. For example, a corresponding mask for forming resistor elements may be efficiently used during the corresponding etch process, thereby avoiding an additional process sequence for defining metal semiconductor free areas in resistors, as required in conventional approaches. Consequently, if considered appropriate, respective additional spacer elements may no longer be used.

Furthermore, the previously provided fill material may also be advantageously used, after having removed the capping material and thereby also having reduced a height of initially provided spacer elements, as an implantation mask for introducing additional implant species, such as dopants, counter-dopants, diffusion enhancing or mitigating species and the like, in a locally precisely defined manner, i.e., through the height-reduced spacer elements, thereby providing additional degrees of freedom for adjusting overall transistor characteristics. The additional parameter adjustment may be highly advantageous in complex integrated circuits, in which different "flavors" of transistor elements may result in superior performance of specific electronic functions. For example, additional doping, counter-doping and the like may be applied in a spatially localized manner for basic semiconductor material, wherein any such "fine tuning" of various types of transistor elements would not be possible or would require significant efforts during previous manufacturing stages.

After any such optional implantations of specific species, the spacer elements reduced in height during the previous anisotropic capping material removal may be refilled and patterned, thereby providing an increased process window with respect to typical failure mechanisms frequently associated with the removal of the capping material based on a wet chemical etch recipe in combination with a sacrificial protective spacer element, as, for instance, discussed above when referring to the conventional approach.

Consequently, the plasma-assisted process for removing the capping material provides superior control of the height adjustment of spacer elements and thus provides, in combination with the fill material, conditions for implanting additional implant species for fine-tuning transistor characteristics in a moderately late manufacturing stage. Furthermore, the significant material loss of the raised drain and source regions that is typically experienced in conventional strategies based on wet chemical recipes and sacrificial oxide spacers may be significantly reduced or substantially avoided due to the presence of the fill material.

Moreover, the risk of forming metal semiconductor compound bridges between gate electrode structures and respective contact elements to be formed in a later stage may be reduced. Furthermore, generally, the number of process steps required may be reduced, thereby achieving reduced manufacturing costs. As a further effect of providing the fill material, superior device topography after the removal of the capping material may be obtained, which may also contribute to superior process conditions upon forming a contact level including appropriate dielectric material(s), possibly with strain-inducing effect. The improved surface topography may even provide conditions for forming contact elements in critical device areas, for instance near recessed areas of isolation regions, which may typically suffer from a pronounced surface topography in conventional approaches and which may not allow the formation of contact elements or which would otherwise contribute to a high risk of generating contact failures. Due to the equalizing effect of the fill material, the formation of contact elements in such critical areas may no longer be prohibited by design rules and thus more efficient designs may be accomplished.

According to one illustrative embodiment disclosed herein a semiconductor device is provided including a gate electrode structure positioned above a semiconductor region, raised drain and source regions positioned adjacent to the gate electrode structure, the raised drain and source regions extending to a first height level, and a sidewall spacer element positioned adjacent sidewalls of the gate electrode structure between the raised drain and source regions and the gate electrode structure. The sidewall spacer element includes an upper portion that extends above the first height level, the upper portion of the sidewall spacer element having an inner part and an outer part, wherein the inner part of the sidewall spacer element faces the gate electrode structure and extends to a second height level that is less than a third height level of the outer part of the upper portion of the sidewall spacer element.

According to another illustrative embodiment disclosed herein a semiconductor device is provided including a gate electrode structure positioned above a semiconductor region, raised drain and source regions positioned adjacent to the gate electrode structure, the raised drain and source regions extending to a first height level, and a sidewall spacer element positioned on sidewalls of the gate electrode structure so as to laterally separate the raised drain and source regions from the gate electrode structure. The sidewall spacer element includes an upper portion that extends above the first height level, the upper portion of the sidewall spacer element having an inner part and an outer part, wherein the inner part of the sidewall spacer element faces the gate electrode structure and extends to a second height level that is less than a third height level of the outer part of the upper portion of the sidewall spacer element.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As discussed above, in sophisticated integrated circuits based on planar transistor architecture, currently, transistor elements formed on the basis of critical dimensions of 30 nm and even less may have to be implemented, wherein, in some conventional approaches, a gate electrode structure may be formed in an early manufacturing stage, i.e., the basic configuration of the gate electrode structure may be provided prior to completing the basic transistor configuration, for instance, prior to forming raised drain and source regions. Consequently, the respective gate materials, for instance, sensitive high-k dielectric materials, barrier materials and the like, may have to be reliably encapsulated after having formed the gate electrode structure, which may be accomplished by a spacer element or a spacer structure in combination with a capping material. The removal of the capping material is basically a critical process, since, on the one hand, the reliable encapsulation of the sensitive gate material has to be maintained throughout the entire process sequence or at least contact with an aggressive wet chemical atmosphere has to be avoided, while, on the other hand, the capping material has to be removed across wide areas of the entire semiconductor device, thereby requiring sufficient etch time so as to globally remove the capping materials. Typically, the removal process involves a wet chemical etch recipe, thereby removing material in any direction, which may, therefore, contribute to increased risk of exposing critical materials, thereby typically requiring the formation of protective spacer elements, which in turn may further include deposition and patterning processes that, therefore, contribute to overall process complexity and increase the overall risk of generating device failures.

According to the principles disclosed herein the process complexity may be significantly reduced compared to the conventional approach by using a fill material, which may reliably cover at least the bottom part of the gate electrode structures, and thus the raised drain and source regions, prior to removing the capping material. Moreover, by applying a highly directional etch process, for instance, a plasma-based anisotropic etch recipe, the capping material may be removed in a highly controlled manner, thereby reducing the probability of exposing critical device areas, even if the sidewall spacers at the sidewalls of the electrode structures may be reduced in height. Moreover, due to the superior controllability of the respective etch process, a controlled material removal may also be achieved for the initial sidewall spacer elements, which, in some illustrative embodiments, may be taken advantage of by performing a further implantation process or process sequence in order to finely tune characteristics of specific types of transistor elements. That is, since the remaining fill material and the gate electrode structures themselves may be used as efficient implantation masks, the reduced height level of the initial sidewall spacer elements may enable a precise self-aligned incorporation of any implant species into the semiconductor material through the spacer elements having the reduced height level. Hence, the specific characteristics of different types of transistors may be adjusted, for instance, by introducing additional dopant species, counter-doping species, diffusion mitigating or diffusion promoting species and the like. In this manner, an additional degree of freedom may be obtained for forming "different" types of transistor elements, having, for instance, different threshold voltages, current-carrying capacity and the like, wherein any such implantation induced adjustments may be difficult to achieve in earlier manufacturing stages.

Figure 1A:
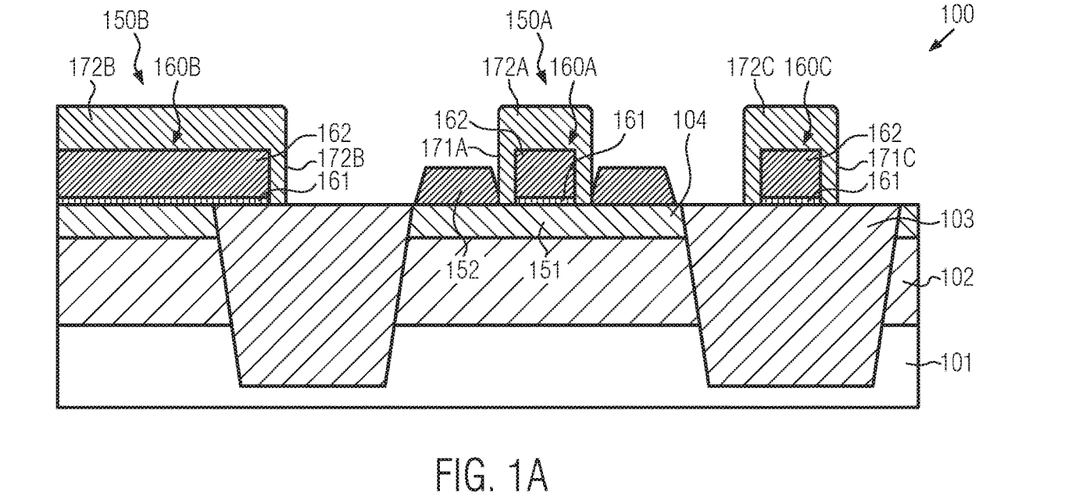
FIGS. 1A-1F schematically illustrate cross-sectional views of a semiconductor device during various manufacturing stages in removing a capping material on the basis of a fill material, according to illustrative embodiments.

FIG. 1A schematically illustrates a cross-sectional view of a semiconductor device 100 in a moderately advanced manufacturing stage. As illustrated, the semiconductor device 100 may include a substrate 101, which may represent any appropriate carrier material for forming thereon or therein semiconductor-based circuit elements. For example, the substrate 101 may include a crystalline semiconductor material, at least at an upper portion thereof, for instance, in the form of crystalline silicon, crystalline germanium and the like. Furthermore, semiconductor layers or regions 104 may be formed above the substrate 101 and may have specific lateral dimensions, i.e., in FIG. 1A, dimensions in the horizontal direction and in a direction perpendicular to the drawing plane of FIG. 1A. As previously discussed, in sophisticated semiconductor devices, the semiconductor regions 104, also referred to as active regions, may include any appropriate semiconductor material, such as crystalline silicon, crystalline silicon/germanium, crystalline silicon/carbon and the like, depending on the type of circuit element to be formed in and above the respective semiconductor regions 104. Furthermore, at least some transistor elements to be formed on the basis of the semiconductor region 104 may require a fully depleted configuration, i.e., a fully depleted channel region 151, which may typically be accomplished by providing the semiconductor region 104 with a thickness of 15 nm or even significantly less, for instance, approximately 5-8 nm.

Moreover, in some illustrative embodiments, at least some transistor elements of the semiconductor device, such as a transistor element 150A, may be formed on the basis of an SOI architecture, wherein a buried insulating layer 102 may be positioned below the respective semiconductor region 104, thereby vertically, i.e., in FIG. 1A, along the vertical direction, isolating the semiconductor region 104 from the substrate material 101. The buried insulating layer 102 may be formed by well-established wafer bond techniques, in which the layer 102 is formed on top of a carrier substrate, is then bonded with a "donor wafer," followed by a cleaving process so as to obtain the semiconductor layer for the region 104. The buried insulating layer 102 may have any appropriate configuration in terms of material composition, layer thickness and the like so as to comply with the requirements for the respective circuit elements of the semiconductor device 100. For example, the buried insulating layer 102 may include silicon dioxide, silicon nitride, silicon oxynitride, a high-k dielectric material, or any combination thereof with a layer thickness of approximately 20-50 nm, wherein these parameters may be adapted as needed.

Moreover, isolation regions 103 laterally delineating respective active regions 104 may be provided, for instance, in the form of shallow trench isolations, moderately deep isolation trenches and the like, which may be filled with an appropriate dielectric material, such as silicon dioxide, silicon nitride and the like. For example, the lateral dimensions of the transistor element 150A may be defined on the basis of the isolation regions 103 and may correspond to device requirements, for instance, in terms of current-carrying capacity, switching speed and the like. For example, in FIG. 1A, the cross-section of the transistor element 150A may illustrate a length dimension, i.e., the horizontal direction in FIG. 1A, while a width dimension of the transistor may extend along the direction perpendicular to the drawing plane of FIG. 1A.

Furthermore, the semiconductor device 100 may include a plurality of non-transistor elements 150B, such as resistors and the like, which, in some illustrative embodiments as illustrated in FIG. 1A, may be formed at least partially above a respective semiconductor region 104.

The transistor element 150A and the non-transistor element 150B may include a respective electrode structure, which in the case of the transistor element 150A may also be referred to as a gate electrode structure 160A, while, in the case of the non-transistor element 150B, an electrode structure 160B may be provided with any appropriate lateral dimensions so as to obtain a desired resistivity, as also discussed above. It should be appreciated that basically, except for the lateral dimensions, the electrode structures 160A, 160B may have the same configuration in terms of material composition. For example, the electrode structures 160A, 160B may include a dielectric material or dielectric materials 161, such as silicon dioxide, silicon oxynitride and the like, optionally in combination with a high-k dielectric material, so as to obtain a desired high capacitive coupling, as discussed above. Moreover, one or more conductive materials 162 may be typically provided, wherein at least a portion of the material 162, which may also be referred to as an electrode material, may be incorporated in the form of a semiconductor material, for instance, in the form of silicon in an amorphous and/or polycrystalline state, silicon/germanium and the like. Moreover, the electrode structures 160A, 160B may include other materials, such as threshold adjusting materials, conductive barrier materials, for instance in the form of titanium nitride, and the like, wherein, for convenience, any such materials are not illustrated in FIG. 1A. In highly advanced transistor elements, such as the transistor element 150A, a length of the gate electrode structure 160A may be 30 nm and significantly less. In densely packed device areas, such as static RAM (random access memory) areas, also a width of the transistor elements may be of comparable dimension, such as approximately 60 nm and even significantly less, for instance in some embodiments, approximately 40 nm and less, thereby contributing to enhanced overall packing density.

Moreover, as illustrated, respective electrode structures 160C may also be provided above a part of the isolation region 103 and may represent respective conductive lines for connecting gate electrode structures of respective transistor elements (not shown) or may provide electrical connectivity between circuit elements without acting as a control electrode. As discussed above, the electrode structure 160C may have a similar configuration as the electrode structures 160A, 160B in terms of material composition. For example, when the electrode structure 160C may be understood as a connection between the respective gate electrode structures, also the length dimension of the electrode structure 160C may basically correspond to the length dimension of the gate electrode structure 160A. The electrode structures 160A, 160B, 160C may collectively be referred to as electrode structures 160, if appropriate.

Moreover, the respective electrode structures 160 may include respective spacer elements formed on sidewalls of the corresponding electrode structures 160, for instance, indicated by 171A, 171B, 171C, in order to, among other things, reliably encapsulate any sensitive materials of the respective electrode structures 160. Furthermore, a respective capping material 172A, 172B, 172C may be formed on top of the respective electrode structures 160, as also discussed above.

The sidewall spacer elements 171A, 171B, 171C may be collectively referred to as spacer elements 171, if appropriate. Similarly, the capping materials 172A, 172B, 172C may be collectively referred to as capping materials 172, if appropriate.

It should be appreciated that respective sidewall spacers elements 171A, 171B, 171C and the respective capping materials 172A, 172B, 172C may be provided in the form of any appropriate material, such as silicon nitride, silicon dioxide or any combination thereof. For example, a thin liner material (not shown) may be formed between the actual electrode structures 160 and the corresponding sidewall spacer elements 171 and/or capping materials 172.

In this manufacturing stage, respective drain and source regions 152 may be formed in the transistor element 150A, and possibly in the non-transistor element 150B, which may not be visible in FIG. 1A, since the cut through the non-transistor element 150B is taken along its "width" direction extending through the electrode structure 160B. The raised drain and source regions 152 may include any appropriate crystalline semiconductor material, such as silicon, silicon/germanium and the like in combination with a high dopant concentration, as discussed above.

The semiconductor device 100 as shown in FIG. 1A may be formed on the basis of well-established process strategies, in which the substrate material 101, possibly including the buried insulating layer 102 and an initial semiconductor layer may be provided as a dedicated SOI substrate, wherein an initial thickness of the semiconductor layer (not shown) may be 15 nm and even less, when at least some transistor elements may have to be formed on the basis of a fully depleted configuration. Thereafter, the basic characteristics of the semiconductor layer may be locally adapted, for instance, in terms of material composition, doping and the like, which may be accomplished by material removal processes in combination with selective epitaxial growth techniques for forming, for instance, a silicon/germanium material at some locations of the device 100, and the like. In this manner, the respective basic characteristics of the various active regions 104 may be adjusted.

Moreover, appropriate dopants may be introduced into the substrate 101 in order to adjust overall basic transistor characteristics, while a further fine-tuning may be accomplished in a later stage. Thereafter, or in between, the isolation regions 103 may be formed by sophisticated patterning strategies and deposition processes, thereby defining the lateral dimensions of the respective active regions 104. It should be noted that some shallow isolation trenches (not shown) may undergo material loss during various etch and cleaning processes, thereby contributing to a pronounced surface topography. Next, the electrode structures 160 may be formed by depositing appropriate materials and patterning the same in order to define the lateral dimensions of the various electrode structures 160, followed by the deposition of one or more spacer materials, which may be patterned into the respective sidewall spacer elements 171. The capping materials 172 may represent, at least partially, remains of a previously provided hard mask material and the like.

Thereafter, a more or less complex process sequence may be applied so as to cover certain active regions and respective electrode structures with hard mask material for selectively growing a desired crystalline semiconductor material on other non-covered exposed semiconductor areas, such as the active regions 104, thereby obtaining the raised drain and source regions 152 having a desired in situ dopant concentration obtained during the epitaxial growth process. For example, P-type devices may receive boron doped SiGe-material, while N-type devices may receive phosphorous doped silicon material during respective epitaxial growth processes. Thereafter, respective mask materials may be removed and further mask material may be deposited, if required, for performing a further selective epitaxial growth process that complies with the requirements of different types of transistor elements. It should be appreciated that, during the respective epitaxial growth processes, the capping materials 172 and spacers 171 may reliably protect the electrode structures so as to not avoid a deposition of any semiconductor material on the respective semiconductor materials of the electrode structures 160.

Figure 1B:
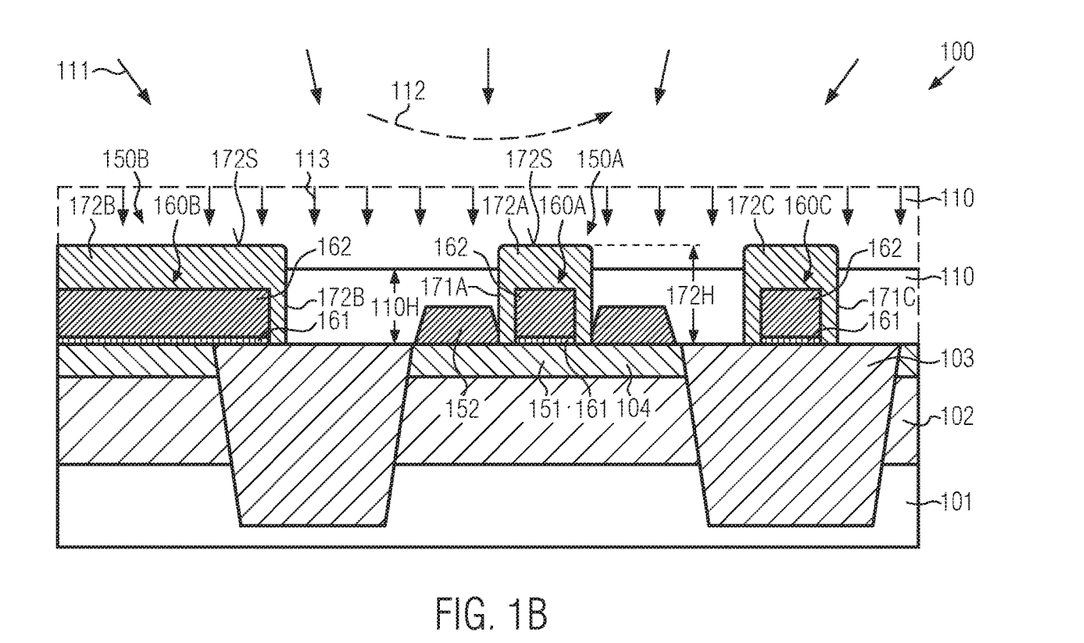

FIG. 1B schematically illustrates the semiconductor device 100 in a further advanced manufacturing stage. As shown, a fill material 110, such as a silicon dioxide material or any other appropriate material that exhibits sufficient stability for being used during the further processing, may be formed adjacent to the electrode structures 160. As illustrated, in some illustrative embodiments, a height level 110H of the fill material 110 may be adjusted so as to extend above the raised drain and source regions 152, however, it may be positioned below a height level 172H of the top surface 172S of the capping materials 172, thereby exposing the top surface 172S of the respective capping materials 172. Consequently, at least the raised drain and source regions 152 may reliably be encapsulated by the fill material 110.

The fill material 110 may be formed by any appropriate deposition process, such as a spin-on-technique, indicated as 111, thereby providing a substantially planar surface topography. In order to address specific height differences, for instance between device areas with increased packing density of respective electrode structures, such as RAM areas and the like, and device areas with "isolated" electrode structures, in some illustrative embodiments, a planarization process 112 may be applied, for instance using chemical mechanical polishing (CMP) techniques, for which a plurality of recipes are available for planarizing a plurality of different types of materials, such as silicon dioxide and the like. For example, during a respective optional planarization process 112 the material removal may be continued until the top surface 172S of the various capping materials 172 is exposed. Consequently, the capping materials 172 may be efficiently used as a stop material for controlling the planarization process 112. For example, respective CMP recipes for removing oxide material with high selectivity to silicon nitride material are well established.

Thereafter, the desired height level 110H may be adjusted by performing an additional etch process 113, which may be based on wet chemical recipes and/or plasma assisted etch recipes.

In some illustrative embodiments, in this manufacturing stage, an etch mask (not shown) may be formed so as to expose areas in which a connection to the substrate material 101 is to be established, by removing the respective portion of the semiconductor region 104 and the buried insulating layer 102. For example, such regions with direct connection to the substrate material 101 may be required for providing electrical connection to the substrate 101, for instance, for implementing a back bias mechanism, while, in other cases, specific circuit elements may be formed in the substrate material 101, such as substrate diodes, high voltage transistor elements and the like. Consequently, in any such areas, in which the initial semiconductor material 104 and the buried insulating layer 102 have to be removed, a connection to the substrate 101 may be accomplished, while a regrowth of crystalline semiconductor material may be avoided, thereby contributing to reduced process complexity.

Figure 1C:
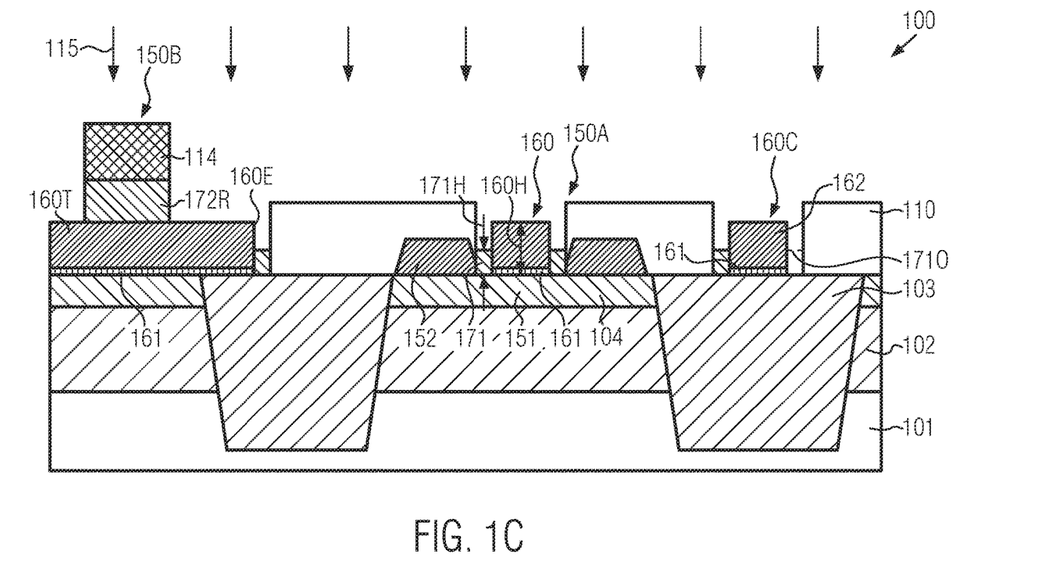

FIG. 1C schematically illustrates the semiconductor device 100 in a further advanced manufacturing stage. As illustrated, an etch mask 114, for instance, in the form of resist material or any other appropriate material, may be formed so as to cover a central portion 160T of the electrode structure 160 of the non-transistor element 150B, while a respective portion 160E may be exposed. Similarly, the electrode structure 160A of the transistor element 150A and the electrode structure 160C formed on the isolation region 103 may be exposed in order to enable the removal of the respective capping materials 172 (see FIG. 1B).

Moreover, the semiconductor device 100 is subjected to an etch process 115 having high directionality, for instance, using a plasma assisted anisotropic etch process, for which a plurality of well-established recipes are available. Consequently, during the etch process 115, the exposed areas of the capping materials 172 (see FIG. 1B) may be removed, while a desired central portion 172R covered by the etch mask 114 may be preserved. On the other hand, the fill material 110 as well as the material of the electrode structures 160, for instance, a respective liner material (not shown), if provided, or the material of the structures 160 itself may act as an etch stop material. Consequently, during the etch process 115 based on the etch mask 114, on the one hand, the capping materials may be reliably removed in a highly controlled manner, while. on the other hand, the capping material 172 of the non-transistor element 150B may be patterned so as to preserve the desired central portion 172R, which may be used for adjusting the resistivity of the non-transistor element 150B, as also discussed above. Consequently, superior process control and a reduced number of process steps may be achieved by using the common etch process 115 for removing the capping materials 172 of the electrode structures 160 exposed by the etch mask 114 and patterning the capping material 172R above the non-transistor element 150B. Moreover, the fill material 110 provides superior protection of the device areas, in particular the raised drain and source regions 152, thereby substantially avoiding undue material loss of these regions.

Furthermore, as illustrated, during the etch process 115, also the desired height level 171H of the sidewall spacer elements 171 may be adjusted, as required for the further processing. In some illustrative embodiments, the height level 171H may be selected to be less than the height level 160H of the electrode structures 160, wherein even a substantially complete removal of the sidewall spacer elements 171 may be implemented in some illustrative embodiments, as for instance indicated by the dashed line 171O representing a substantially "zero" height level and thus a substantially complete removal of the sidewall spacer elements 171. It should be appreciated that reducing the height level 171H of the sidewall spacer elements 171 may still result in substantially avoiding undue adverse effects on the sensitive materials of the electrode structures 160 due to the highly directional etch process 115, even if a substantially complete removal of the spacer elements 171 may be implemented.

Figure 1D:
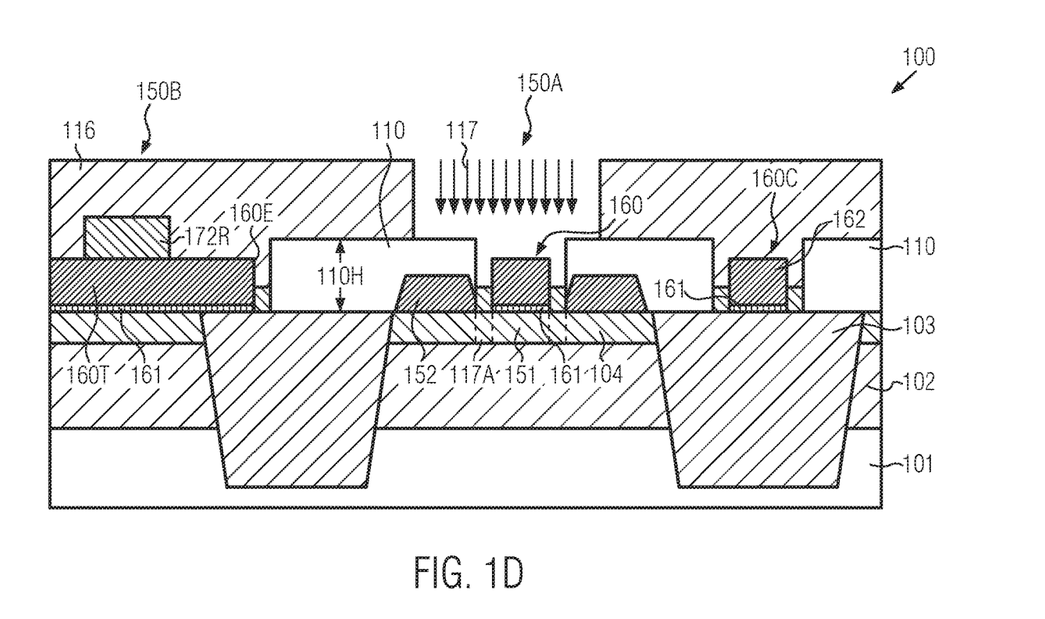

FIG. 1D schematically illustrates the semiconductor device 100 according to some illustrative embodiments in which characteristics and thus performance of at least some types of transistor elements may be adjusted on the basis of one or more additional implantation processes. To this end, an implantation mask 116 may be formed so as to expose respective transistor elements that require additional fine-tuning of their characteristics. For example, the transistor element 150A may represent a transistor that may need additional tuning of transistor characteristics based on one or more implant species incorporated during one or more implantation processes 117. Consequently, the implantation mask 116 may be provided on the basis of a substantially non-critical lithography process, as the respective position and size of a mask opening may be less critical as long as at least the respective electrode structure 160 and a small neighborhood thereof is exposed. Consequently, during the one or more implantation processes 117, any appropriate species may be incorporated, for instance, a dopant for increasing a dopant concentration in an area 117A, if considered appropriate for adjusting the final transistor characteristics. In other cases, a counter-dopant may be incorporated so as to form a halo region in order to provide a sharper PN junction, if appropriate. In other cases, both types of dopant species may be incorporated during respective implantation processes of the sequence 117 at different implantation energies so as to provide a different penetration depth of the respective dopant species, if considered appropriate. In other cases, implant species may be incorporated, for instance in the form of carbon and the like, so as to influence the diffusion behavior of the dopant species that may have been incorporated into the drain and source regions 152 in an earlier phase. Consequently, during the one or more implantation processes 117, the electrode structure 160 may act as an implantation mask, as long as the implantation energy is appropriate for not penetrating through the electrode structure 160 and into the channel region 151, which may readily be accomplished by selecting an appropriate height level 171H (see FIG. 1C) and applying appropriate parameters for the implantation energy. Appropriate parameters may be readily determined based on simulation, experiments and the like. Furthermore, if incorporation of the implant species during the one or more processes 117 into the drain and source regions 152 is considered inappropriate, the height level 110H of the fill material 110 may be selected so as to suppress penetration of the regions 152 by implant species.

It should be appreciated that a respective sequence of implantation processes may be repeated on the basis of different implantation masks 116 in order to adjust or finely tune the characteristics of different types of transistor elements. Consequently, an additional degree of freedom may be provided so as to obtain different "flavors" of transistor elements in a late manufacturing stage, substantially without contributing to overall process complexity, since forming and removing respective implantation masks, such as the mask 116, may be accomplished on the basis of well-established process strategies.

Figure 1E:
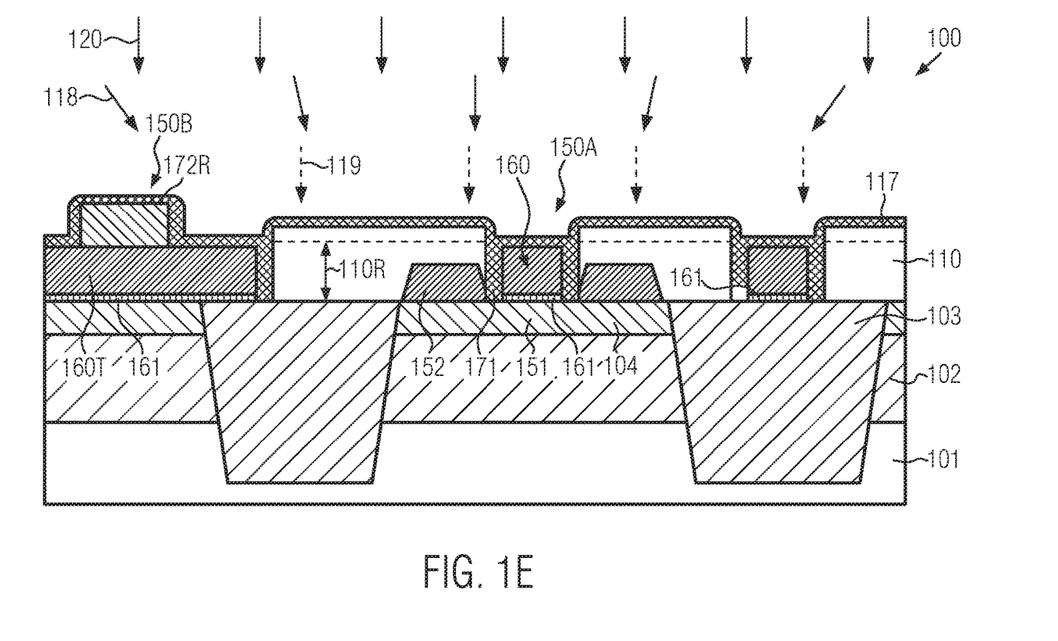

FIG. 1E schematically illustrates the semiconductor device 100 when subjected to a deposition process 118 for forming a spacer layer 117, thereby "refilling" or "repairing" the initial sidewall spacer elements 171 so as to substantially completely cover the sidewalls of the electrode structures 160. To this end, any appropriate spacer material, such as silicon nitride, silicon dioxide or any other appropriate material, may be deposited on the basis of appropriate deposition techniques, wherein the respective filling capabilities may be achieved by selecting appropriate deposition parameters. To this end, well-established recipes are available.

In other illustrative embodiments, prior to performing the deposition process 118 for forming the spacer layer 117, a removal process 119 may be applied, during which a portion of the fill material 110 may be removed in order to obtain a reduced height level 110R. For example, the reduced height level 110R may be selected so as to enhance the gap filling capabilities during the deposition process 118 or to substantially completely avoid pronounced gaps between the fill material 110 and the respective electrode structures 160, thereby significantly relaxing any requirements with respect to the gap filling capabilities of the deposition process 118.

Thereafter, if required, an anneal process may be applied, wherein also implant species, if provided in an earlier manufacturing stage, may be activated.

After having re-established the sidewall spacer elements 171 on the basis of the spacer layer 117, unwanted portions of the spacer layer 117 may be removed on the basis of a further etch process 120, which, in one illustrative embodiment, may be performed on the basis of a plasma assisted etch recipe, thereby obtaining a high degree of directionality, as is well known for forming sidewall spacer elements based on plasma assisted etch recipes. In other illustrative embodiments, the etch process 120 may include, in addition to or alternatively to a plasma assisted etch recipe, a wet chemical etch recipe, thereby also efficiently removing exposed portions of the spacer layer 117, while using the fill material 110 and the electrode structures 160 as efficient etch stop materials.

Figure 1F:
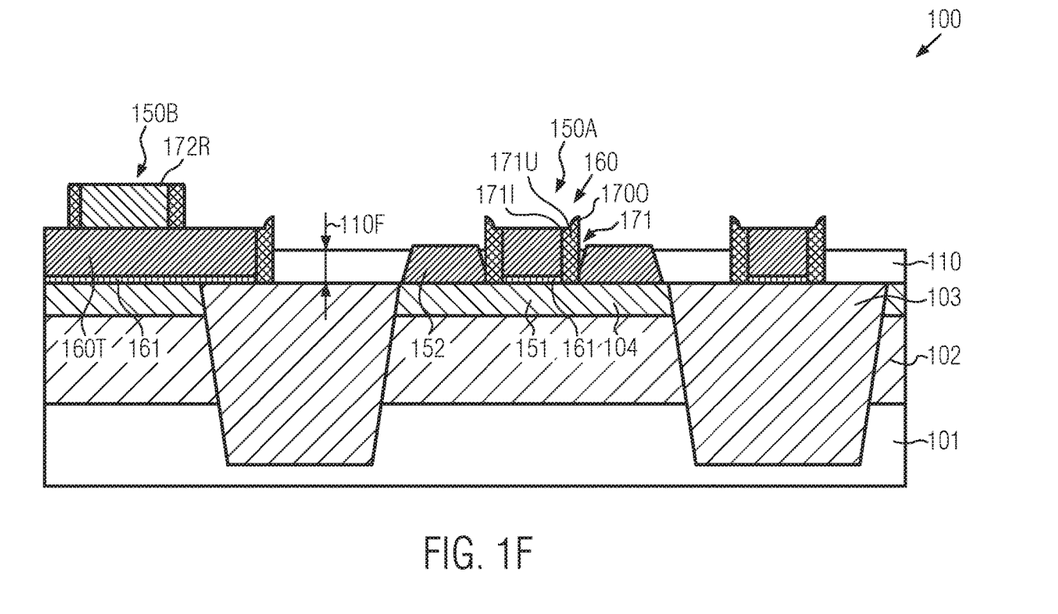

FIG. 1F schematically illustrates the semiconductor device 100 in a further advanced manufacturing stage. That is, after the above-described process sequence, a further etch process may be applied so as to remove material of the fill material 110 in order to obtain a final desired height level 110F. To this end, well-established selective etch recipes are available for, for instance, etching silicon dioxide selectively with respect to silicon nitride, silicon and the like. The final height level 110F may be selected so as to comply with requirements for forming a metal semiconductor compound in the raised drain and source regions 152. Thus, in some illustrative embodiments, the height level 110F is selected so as to at least expose a top surface of the raised drain and source regions 152. At the same time, also the respective surfaces of the electrode structures 160 may be exposed, wherein these surface areas may have been covered by an etch stop liner (not shown), if considered appropriate. For instance, a respective liner may have been deposited prior to forming the spacer layer 117 (see FIG. 1B).

Furthermore, in one illustrative embodiment, as illustrated in FIG. 1F, the resulting sidewall spacers 171 may have a specific shape caused by the previous etch process 120 (see FIG. 1E), when performed as a plasma assisted etch process having high directionality. In this case, the sidewall spacer elements 171 may have an upper portion 171U, i.e., a portion that extends above the raised drain and source regions 152, wherein an inner part 171I, i.e., the part that is contact with and facing the electrode structure 160, has a height level that is less than the height level of an outer part 171O, i.e., the part that is not in direct contact with the electrode structure 160 and thus faces away from the electrode structure 160. Thus, the outer part 171O may represent a "horn-like" part of the sidewall spacer elements 171.

In other cases, when a substantially isotropic etch recipe may have been applied during the process 120 (see FIG. 1E), respective horn-like outer parts 171O may not have been formed.

Based on the device configuration as shown in FIG. 1F, the further processing may be continued, for instance, by incorporating a highly conductive metal semiconductor compound and forming a contact level, as will be described in more detail later on with reference to FIG. 2F.

With reference to FIGS. 2A-2F, further illustrative embodiments will now be described in more detail, wherein reference may also be made to the semiconductor device 100 as described in the context of FIGS. 1A-1F.

Figure 2A:
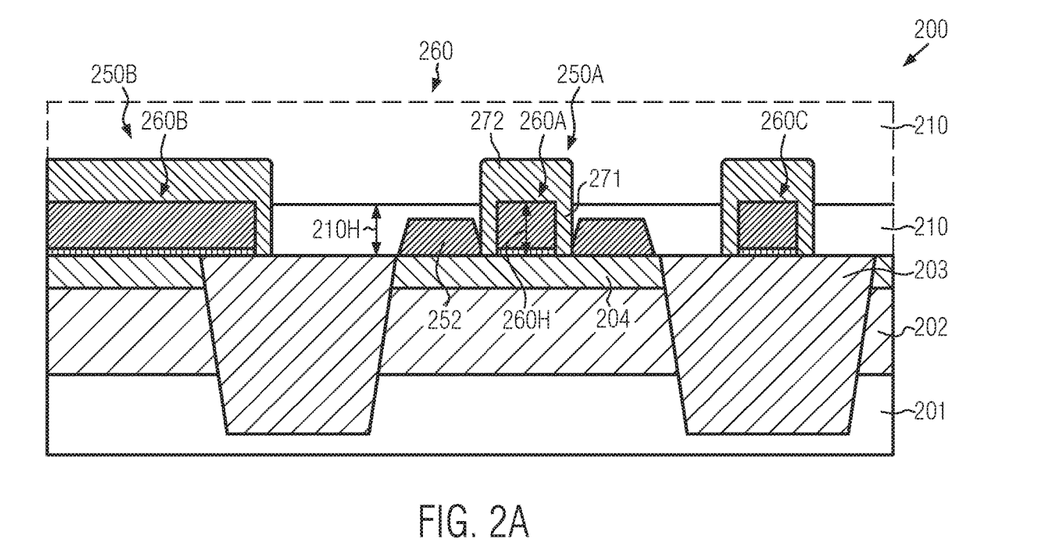
FIGS. 2A-2F schematically illustrate cross-sectional views of a semiconductor device during various manufacturing stages upon removing a capping material on the basis of fill material provided with a different height level compared to the embodiments as illustrated in FIGS. 1A-1F, according to further illustrative embodiments.

FIG. 2A schematically illustrates a cross-sectional view of a semiconductor device 200 including a transistor element 250A and a non-transistor element 250B in a moderately advanced manufacturing stage. As shown, the transistor element 250A may include a gate electrode structure 260A, while the non-transistor element 250B may include an electrode structure 260B. Furthermore, an electrode structure 260C may be formed on an isolation region 203. For convenience, and as also discussed above in the context of the semiconductor device 100, the electrode structures 260A, 260B, 260C may commonly be referred to as electrode structures 260, since these structures may have substantially the same configuration, except for lateral dimensions thereof, as also discussed above in the context of the semiconductor device 100. Furthermore, the semiconductor device 200 may include a substrate 201, in some illustrative embodiments a buried insulating layer 202, and respective semiconductor regions or active regions 204. Moreover, raised drain and source regions 252 may be formed at least on some of the active regions 204.

As also discussed above in the context of the semiconductor device 100, the electrode structures 260 may be encapsulated by respective sidewall spacer elements 271 and capping materials 272.

It should be appreciated that regarding any aspects in terms of material composition and manufacturing techniques for components discussed so far for the device 200, the same criteria may apply as previously explained in the context of the semiconductor device 100. For example, similar or like components of the semiconductor device 100 may correspond to components of the semiconductor device 200 having the same reference numerals, except for the leading digit "2" for the semiconductor device 200 instead of a leading digit "1" for the semiconductor device 100. Consequently, any further discussion of such components will be omitted here.

Moreover, a fill material 210 may be formed above and in between the respective electrode structures 260 based on any appropriate deposition technique, such as spin-on techniques for providing the fill material 210 with any appropriate material composition. An initial height level of the fill material 210, as indicated by the dashed lines, may be reduced, for instance by first applying a planarization process so as to planarize or reduce global height differences, followed by an etch process in order to adjust a desired height level 210H of the fill material 210. In one illustrative embodiment, the height level 210H may substantially correspond to a height level 260H of the electrode structures 260. It should be appreciated that the height level 210H corresponding to the height level 260H may include minor differences in height level of approximately 10 nm and less, for example 5 nm and less. Controlling the adjustment of the height level 210H to the desired target value, such as the height level 260H, may be readily accomplished by selecting appropriate process parameters that may be determined by experiment.

Figure 2B:
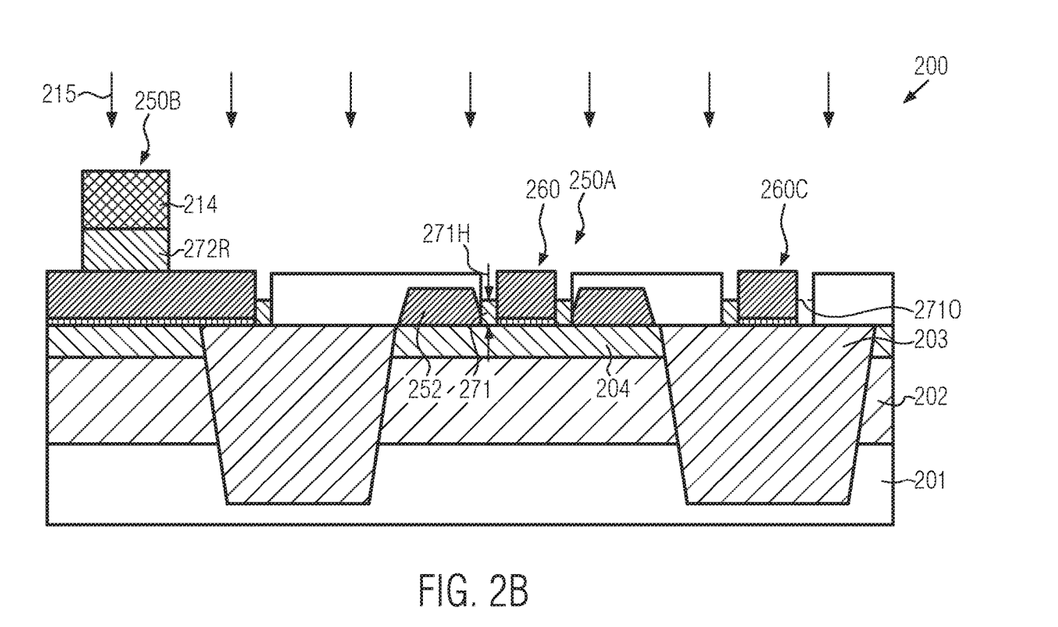

FIG. 2B schematically illustrates the semiconductor device 200 when subjected to a directional etch process 215, for example a plasma assisted etch process with anisotropic characteristics in order to remove the capping materials 272 (see FIG. 2A), while preserving a portion 272R of the non-transistor element 250B by providing a respective etch mask 214. Consequently, as also discussed in the context of FIG. 1C for the semiconductor device 100, the well-controllable etch process 215 with high directionality enables the removal of the respective capping materials of the electrode structures 260, while at the same time it ensures reliable patterning of the capping material of the non-transistor element 250B in order to preserve the desired portion 272R. By appropriately controlling the etch process 215, also a desired height level of the spacer elements 271 may be adjusted, as indicated by 271H, wherein, if desired, a substantially complete removal of the sidewall spacers 271 be accomplished, as indicated by the dashed line 271O.

Regarding any specifics of the etch process 215, it may also be referred to the process 115 as discussed in the context of FIG. 1C. Similarly, with respect to providing openings for connecting to the substrate material 201, the same criteria may apply as discussed above.

Figure 2C:
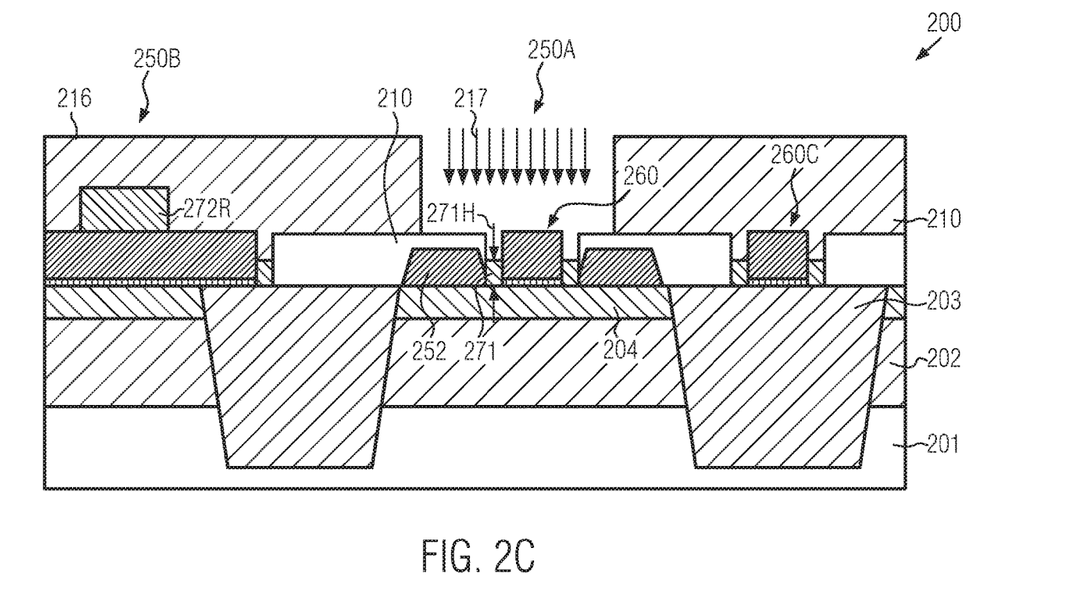

FIG. 2C schematically illustrates the semiconductor device 200 according to illustrative embodiments in which one or more implantation processes 217 may be performed on the basis of an implantation mask 216, which may expose respective transistor elements, such as the transistor element 250A, which may require the incorporation of implant species through the sidewall spacers 271 having the appropriately reduced height level 271H. With respect to any concepts for introducing implant species and/or performing the one or more implantation processes 217 and/or providing one or more implantation masks 216, the same criteria may apply as previously discussed in the context of FIG. 1D for the semiconductor device 100.

Figure 2D:
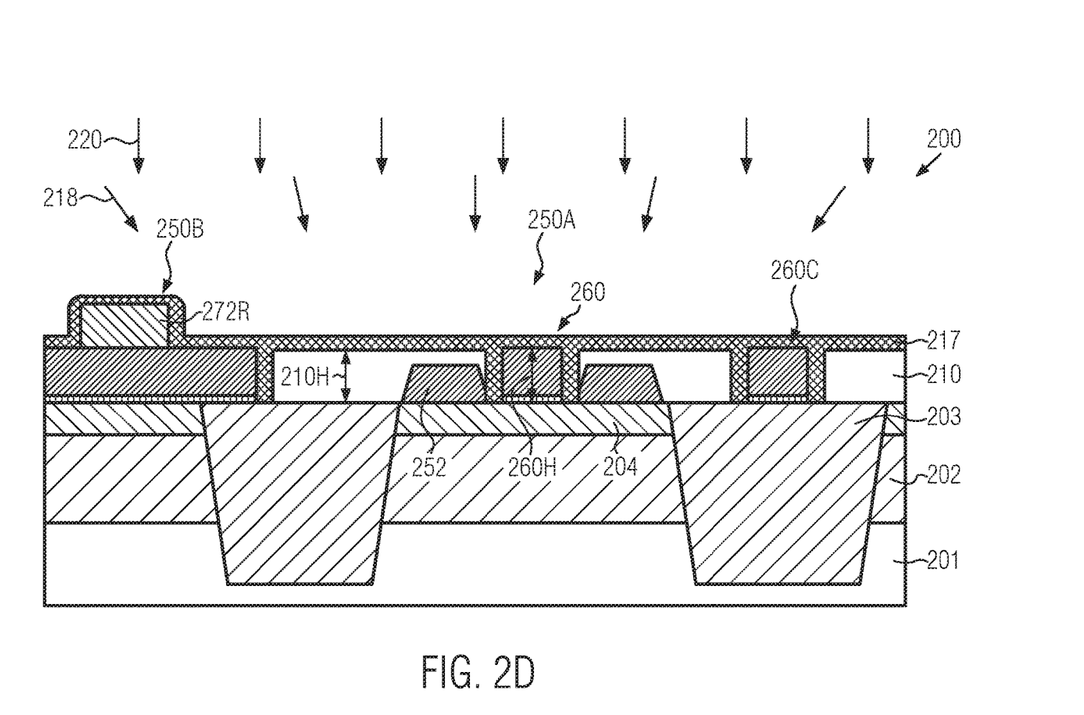

FIG. 2D schematically illustrates the semiconductor device 200 in a further advanced manufacturing stage, in which a spacer layer 217, for instance including any appropriate material, such as silicon nitride and the like, may be formed during a deposition process 218. The deposition process 218 may be designed so as to appropriately refill or repair the sidewall spacers 271 (see FIG. 2C), wherein the substantially equal height levels 210H and 260H of the fill material 210 and the electrode structures 260, respectively, may result in a less pronounced surface topography and thus superior conditions.

In other illustrative embodiments (not shown), the height level 210H may further be reduced by performing an etch process, thereby even further reducing any depth of gaps to be filled upon forming the spacer layer 217.

Next, an etch process 220 may be performed so as to remove material of the spacer layer 217 from at least horizontal portions of the semiconductor device 200, which may be accomplished on the basis of selective anisotropic etch recipes and/or selective isotropic etch recipes, as also discussed above in the context of the semiconductor device 100.

Thereafter, an anneal process may be applied, during which implant species, which may have optionally been introduced in the previous manufacturing stage as shown in FIG. 2C, may also be activated and implantation induced damage may be repaired.

Figure 2E:
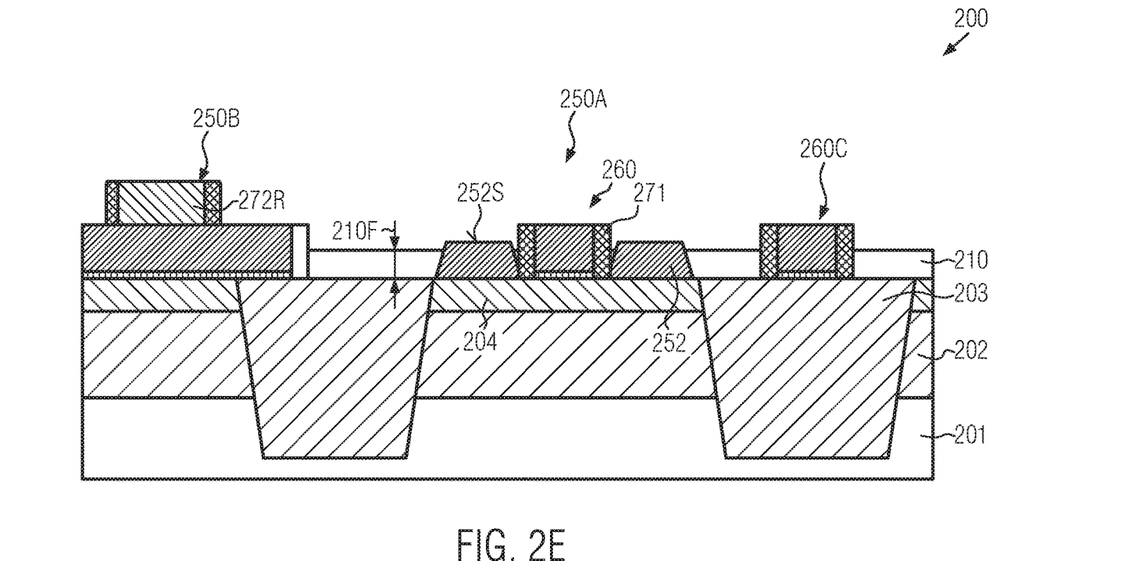

FIG. 2E schematically illustrates the semiconductor device 200 after completing the above-described process sequence and after further reducing the height level of the fill material 210 to obtain a desired final height level 210F. To this end, any well-established selective etch recipes may be applied in order to remove material of the material 210, thereby at least exposing a top surface 252S of the raised drain and source regions 252.

On the basis of the semiconductor device 200 as shown in FIG. 2E and also on the basis of the semiconductor device 100 as shown in FIG. 1F, the further processing may be continued in the presence of the respective fill materials 110, 210, as will be discussed in more detail with reference to FIG. 2F.

Figure 2F:
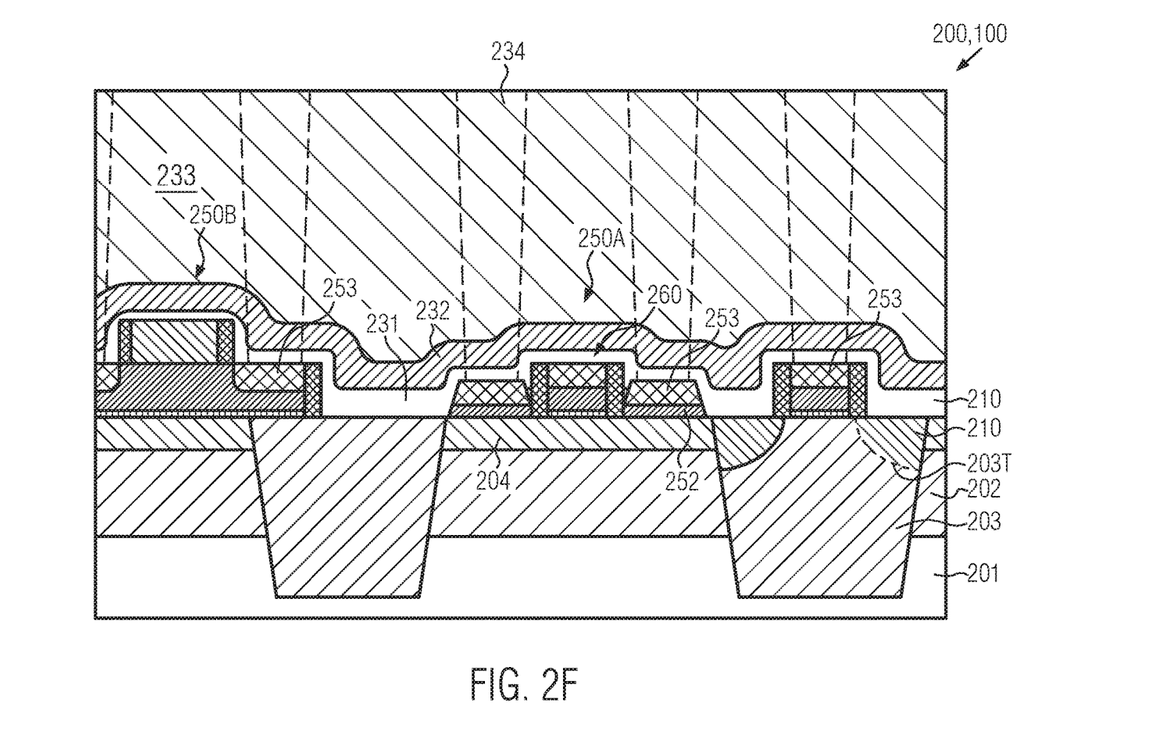

FIG. 2F schematically illustrates the semiconductor device 200 or the semiconductor device 100 in a further advanced manufacturing stage. It should be noted that, for reasons of convenience, reference numbers depicted in FIG. 2F with respect to components described so far relate to the semiconductor device 200. However, these components and reference numerals may also indicate respective components of the semiconductor device 100.

As illustrated, metal semiconductor compounds 253, for instance in the form of nickel silicide, nickel/platinum silicide and the like, may be formed in the electrode structures 260 and in the raised drain and source regions 252. To this end, any appropriate process sequence may be applied, for instance, starting from the devices 100, 200, as shown in FIGS. 1F and 2E, respectively, by applying respective cleaning sequences in order to prepare the exposed semiconductor containing surface areas for initiating a chemical reaction. For example, any appropriate material or materials may be deposited, such as nickel and/or platinum and/or cobalt and the like, and may be treated so as to initiate a chemical reaction with the underlying semiconductor material, for instance, by forming a silicide material having superior conductivity compared to even heavily doped semiconductor material. It should be appreciated that the respective process sequence may also include the removal of any non-reacted material and possibly a further heat treatment in order to tune the desired material characteristics.

Thereafter, a contact level 230 may be formed, wherein, as discussed above, in particular, the provision of the fill material 210 may result in a significantly relaxed surface topography. That is, a respective aspect ratio of gaps in the surface topography is reduced due to the presence of the fill material 210. In particular, at certain isolation regions, a pronounced surface topography may be created in an early manufacturing stage after having formed the isolation regions 203, for example by material loss or by non-filling shallow trenches upon cutting active regions, and the like, as schematically indicated by 203T. In this case, these recessed areas 203T may reliably be filled with the fill material 210, thereby efficiently levelling the previous pronounced surface topography. Consequently, perspective dielectric materials, such as an etch stop liner 231, which may be optionally provided, for instance, in the form of silicon dioxide, and a respective etch stop layer 232, for instance, including silicon nitride and the like, may be formed with a superior fill performance due to the relaxed surface topography. For example, frequently, internal strain may have been induced in one or both of the layers 231, 232, wherein the type of internal strain may even have to vary in different device areas, thereby possibly requiring complex masking, deposition and etch techniques. Conventionally, the pronounced recessed areas 203T may result in inferior performance when forming the respective dielectric materials 231, 232. For example, respective voids may be created during depositing into high aspect ratio gaps, and such voids may even extend deeply into other device areas, thereby representing a high risk for generating contact failures. Therefore, forming contact elements in these areas may not be allowed in conventional design strategies.

Thereafter, a further dielectric material or materials 233, for instance in the form of silicon dioxide, may be formed which may be provided with different material characteristics so as to comply with the requirements of the respective semiconductor devices 200, 100. Also in this case, the reduced topography obtained by the fill material 210 may again result in superior process controllability when forming the material or materials 233. Next, the further processing may be continued by applying a respective etch sequence so as to form respective contact openings 234 so as to connect to respective areas including the highly conductive metal semiconductor compound 253. For example, in the transistor element 250A, respective contact elements may be formed so as to connect to the drain and source regions 252, while, in the non-transistor element 250B, respective end portions exposed by the residual material 272R may be contacted.

As previously discussed, due to the reliable refilling of any recesses, such as the areas 203T on the basis of the fill material 210, also contact openings may be formed in these areas, which, in conventional approaches, may result in generating respective contact failures.

As a result, the present disclosure provides manufacturing techniques and semiconductor devices in which superior process efficiency may be accomplished by using a fill material for levelling and reliably covering raised drain and source regions during the removal of capping materials of electrode structures, wherein the removal of the capping materials may be accomplished on the basis of highly directional and well-controllable etch techniques, while, in some illustrative embodiments, concurrently patterning a respective capping material of a non-transistor element, whose electrode structure may need the preservation of a portion of the capping material. The concepts disclosed herein may be highly advantageously applied for forming devices on the 22 and 12 nm platform for forming devices including fully depleted SOI transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device, comprising:
a gate electrode structure positioned above a semiconductor region;
raised drain and source regions positioned adjacent to said gate electrode structure, said raised drain and source regions extending to a first height level;
a single first sidewall spacer element positioned adjacent sidewalls of said gate electrode structure between said raised drain and source regions and said gate electrode structure, said single first sidewall spacer element comprising an upper portion that extends above said first height level, said upper portion of said single first sidewall spacer element comprising an inner part and an outer part, wherein said inner part of said single first sidewall spacer element faces and is in physical contact with said gate electrode structure and extends to a second height level that is less than a third height level of said outer part of said upper portion of said single first sidewall spacer element; and
a dielectric fill material that includes a central portion, a first end portion and a second end portion, wherein the first end portion of said dielectric fill material is positioned adjacent to the raised drain and source regions, and wherein a height level of the dielectric fill material is below a height level of the raised drain and source regions.

2. The semiconductor device of claim 1, further comprising:
a second sidewall spacer element positioned on said second end portion of said dielectric fill material, said second sidewall spacer element comprising an upper portion that comprises an inner part and an outer part, wherein said inner part of said upper portion of said second sidewall spacer element faces said central portion of said dielectric fill material and said outer part of said second sidewall spacer element faces away from said central portion of said dielectric fill material, said inner part of said upper portion of said second sidewall spacer element extending to a height level that is higher than a height level of said outer part of said upper portion of said second sidewall spacer element.

3. The semiconductor device of claim 2, further comprising a non-transistor element including an electrode structure, wherein the outer part of the upper portion of the second sidewall spacer element is in physical contact with the electrode structure of the non-transistor element.

4. The semiconductor device of claim 1, wherein said single first sidewall spacer element laterally separates said raised drain and source regions and said gate electrode structure.

5. The semiconductor device of claim 1, further comprising:
   a non-transistor element including an electrode structure; and
   a single third sidewall spacer element positioned adjacent sidewalls of the electrode structure of the non-transistor device, the single third sidewall spacer element comprising an upper portion that extends above the first height level, the upper portion of the single third sidewall spacer element comprising an inner part and an outer part, wherein the inner part of the single third sidewall spacer element faces and is in physical contact with the electrode structure of the non-transistor element, extends to the second height level, and is less than a height level of the outer part of the upper portion of the single third sidewall spacer element.

6. The semiconductor device according to claim 5, wherein the non-transistor element and the single third sidewall spacer element are formed over an isolation region.

7. The semiconductor device of claim 5, wherein the second end portion of the dielectric fill material is in physical contact with the outer part of the upper portion of the single third sidewall spacer element.

8. A semiconductor device, comprising:
   a gate electrode structure positioned above a semiconductor region;
   raised drain and source regions positioned adjacent to said gate electrode structure, said raised drain and source regions extending to a first height level;
   a single first sidewall spacer element positioned on sidewalls of said gate electrode structure so as to laterally separate said raised drain and source regions from said gate electrode structure, said single first sidewall spacer element comprising an upper portion that extends above said first height level, said upper portion of said single first sidewall spacer element comprising an inner part and an outer part, wherein said inner part of said single first sidewall spacer element faces and is in physical contact with said gate electrode structure and extends to a second height level that is less than a third height level of said outer part of said upper portion of said single first sidewall spacer element;
   a dielectric fill material that includes a central portion, a first end portion and a second end portion, wherein the first end portion of said dielectric fill material is positioned adjacent to the raised drain and source regions, and wherein a height level of the dielectric fill material is below a height level of the raised drain and source regions; and
   a second sidewall spacer element positioned on and in physical contact with the second end portion of said dielectric fill material.

9. The semiconductor device of claim 8, wherein
   an upper portion of the second sidewall spacer includes an inner part and an outer part, wherein said inner part of said upper portion of said second sidewall spacer element faces said central portion of said dielectric fill material, said inner part of said upper portion of said second sidewall spacer element extending to a height level that is higher than a height level of said outer part of said upper portion of said second sidewall spacer element.

10. The semiconductor device of claim 9, further comprising a non-transistor element including an electrode structure, wherein the outer part of the upper portion of the second sidewall spacer element is in physical contact with the electrode structure of the non-transistor element.

11. The semiconductor device of claim 8, further comprising:
   a non-transistor element including an electrode structure; and
   a single third sidewall spacer element positioned adjacent sidewalls of the electrode structure of the non-transistor device, the single third sidewall spacer element comprising an upper portion that extends above the first height level, the upper portion of the single third sidewall spacer element comprising an inner part and an outer part, wherein the inner part of the single third sidewall spacer element faces and is in physical contact with the electrode structure of the non-transistor element, extends to the second height level, and is less than a height level of the outer part of the upper portion of the single third sidewall spacer element.

12. The semiconductor device according to claim 11, wherein the non-transistor element and the single third sidewall spacer element are formed over an isolation region.

13. The semiconductor device of claim 11, wherein the second end portion of the dielectric fill material is in physical contact with the outer part of the upper portion of the single third sidewall spacer element.

\* \* \* \* \*